United States Patent
Bhawmik et al.

[19]

[11] Patent Number: 6,148,425
[45] Date of Patent: Nov. 14, 2000

[54] BIST ARCHITECTURE FOR DETECTING PATH-DELAY FAULTS IN A SEQUENTIAL CIRCUIT

[75] Inventors: Sudipta Bhawmik, Monmouth Junction; Tapan Jyoti Chakraborty, West Windsor; Nilanjan Mukherjee, Plainsboro, all of N.J.

[73] Assignee: Lucent Technologies Inc., Murray Hill, N.J.

[21] Appl. No.: 09/022,759

[22] Filed: Feb. 12, 1998

[51] Int. Cl.[7] .................................................. G01R 31/28
[52] U.S. Cl. .......................... 714/726; 714/726; 714/729; 714/722; 714/733; 714/727; 714/724; 714/734; 375/22.1; 375/22.5; 395/183.01; 395/183.07
[58] Field of Search .................................... 714/726, 729, 714/722, 733, 727, 724, 734; 375/226, 371; 371/22.1, 22.5; 395/183.01, 183.07

[56] References Cited

U.S. PATENT DOCUMENTS

| | | | |
|---|---|---|---|
| 4,534,028 | 8/1985 | Trishler | 371/25 |
| 4,672,307 | 6/1987 | Breuer et al. | 324/73 |
| 4,931,722 | 6/1990 | Stoica | 371/22.5 |
| 4,937,826 | 6/1990 | Gheewala et al. | 371/22.1 |
| 5,291,495 | 3/1994 | Udell, Jr. | 714/726 |
| 5,305,328 | 4/1994 | Motohara et al. | 714/741 |
| 5,329,533 | 7/1994 | Lin | 371/22.3 |
| 5,422,891 | 6/1995 | Bushnell et al. | 371/22.4 |
| 5,502,730 | 3/1996 | Roy et al. | 714/726 |
| 5,515,383 | 5/1996 | Katoozi | 714/732 |
| 5,592,493 | 1/1997 | Crouch et al. | 714/729 |
| 5,812,561 | 9/1998 | Giles et al. | 714/726 |
| 5,898,702 | 4/1999 | Narayanan et al. | 714/726 |
| 5,923,676 | 7/1999 | Sunter et al. | 714/733 |

*Primary Examiner*—Ayaz R. Sheikh
*Assistant Examiner*—Firmin Backer

[57] ABSTRACT

A scan-based BIST architecture for detecting path-delay faults in a sequential circuit converted to a combinational circuit or a less complex sequential circuit including a combinational portion and a plurality of scan flip-flops. The BIST structure includes a test pattern generator for generating two test patterns and a controller for generating a clock signal and an extended scan mode signal which is held high for two clock cycles while the output response of the combinational portion to the first and second test vectors is latched into the scan flip-flops in order to detect a signal transition. The invention is further directed to a method for detection of path-delay faults using this scan-based BIST architecture. To improve the fault coverage for path-delay faults, observation points may be inserted at the inputs of selected scan flip-flops. A predetermined number of scan flip-flops having the highest activation frequency are selected as the observation points.

8 Claims, 6 Drawing Sheets

BIST ARCHITECTURE FOR DETECTING PATH-DELAY FAULTS IN A SEQUENTIAL CIRCUIT

BACKGROUND OF THE INVENTION

1. Field of the Invention

The present invention relates to a device and method for detecting path-delay faults in a sequential circuit. In particular, the invention provides a clocking scheme for use with a scan-based built-in self-test (BIST) architecture to detect path-delay faults in a sequential circuit and a technique for selecting observation points to improve fault coverage.

2. Description of the Related Art

Integrated circuits comprise one or more individual circuit elements, each of which is either combinational, e.g. a logic gate, or sequential, e.g. a flip-flop. It is beneficial to evaluate a circuit to ensure that it is fault-free. Faults may occur during manufacturing or over time as a result of wearout. Testing of the circuit results in a fault coverage ratio that represents the ratio of faults that can be detected to all faults which are taken into consideration, expressed as a percentage. Fault coverage values range between an ideal value of 100%, where all faults are detected, to 0% where no faults are detected during testing. Test patterns (test vectors) are used to stimulate the primary inputs of a circuit in order to detect the occurrence of faults at the output.

Two commonly detected types of faults are structural faults and timing faults. Structural faults represent a physical defect in the circuit. Stuck-at fault models are widely used to detect structural faults which result in very high fault coverage, e.g. greater than 99%. Stuck-at faults are tested by applying a test pattern (test vector) that, in a fault-free circuit, drives the particular node to generate an output response opposite to that which it would be if the circuit is faulty. As the complexity and size of the circuit increases, the generation of the necessary test patterns to stimulate the circuit also becomes increasingly more complex. To solve this problem random test pattern generators, as for example a linear shift feedback register (LFSR), are used to excite the circuit.

Although it is relatively simple to generate test patterns for detecting faults in a combinational circuit, significantly more complex test vectors are required to detect faults in a sequential circuit because of the need to propagate known values from element to element over time. Sequential circuits are therefore typically converted into a scan-based design. There are basically two types of scan-based designs—full-scan (completely combinational), and partial-scan (partially combinational). In the full-scan design every flip-flop in the sequential circuit is isolated and replaced by a scan flip-flop with a multiplexor at its input built-in as a cell. The scan flip-flops are linked together to form a single scan chain or multiple scan chains. A partial- scan design differs from a full-scan design in that only a select number of flip-flops are replaced by scan flip-flops.

A partial-scan BIST architecture for detecting stuck-at faults in a sequential circuit is disclosed in U.S. Pat. No. 5,329,533, which is herein incorporated by reference. That patented BIST scheme for detecting stuck-at faults is implemented with scan to ameliorate the controllability and observability of a sequential circuit. Random test vectors generated using a linear feedback shift register (LFSR) are applied to the circuit-under-test (CUT) and the corresponding output responses are compressed using a multiple-input-signature-register (MISR) to obtain a signature. The entire test functionality is monitored by a separate BIST controller which is active only in the self-test mode.

Very large scale integrated (VLSI) circuits are also generally tested to detect, in addition to structural faults, the occurrence of timing or path-delay faults. Research and development in the area of path-delay faults is gaining importance as the speed of VLSI circuits continues to increase. Path-delay faults can arise from both manufacturing process parameter variations as well as spot defects in a circuit. Unlike stuck-at faults which require only a single test pattern to stimulate an input, the detection of a path-delay fault requires a set or pair of two test patterns (test vectors) in order to propagate a signal transition through a particular path. In particular, the two test vectors must be sufficiently independent of one another and applied to the circuit at consecutive clock cycles in order to activate a signal transition at the inputs of a circuit. Thus, detection of path-delay faults requires stricter justification and propagation conditions and, as a result, such faults are more difficult to detect using the random test vectors employed for stuck-at faults. Conventional test pattern generators for stuck-at faults are thus unsuitable for path-delay faults in which a correlation exists between successively generated test vectors. As a result, the partial scan-based BIST architecture disclosed in U.S. Pat. No. 5,329,533 for detecting stuck-at faults cannot be used to test for path-delay faults.

U.S. Pat. No. 5,422,891 discloses a BIST method and apparatus for detecting path-delay faults in a combinational circuit by altering the circuit topology. In particular, that invention provides a method whereby cut points are inserted into the circuit for diverting the input of hazardous nodes to an observation point. Outputs of the integrated circuit and at the observation point in response to a hazard free input pattern are processed to generated two signatures that are compared to predetermined correct reference signatures to identify a path-delay fault. The method and apparatus described in that patent, however, is only suitable for path-delay fault testing of combinational circuits which, unlike sequential circuits, have very little practical industrial use.

It is therefore desirable to develop a scan-based BIST architecture for detecting path-delay faults as well as stuck-at faults in a sequential circuit. Moreover, it is desirable to improve the fault coverage result for path-delay fault testing by selecting and inserting observation points into the CUT. of at least one of the scan flip-flops. Observation points are selected by performing path-delay fault testing for each path in a set of paths in the sequential circuit. Those paths which are activated but not detected are then identified. An activation frequency is calculated for each scan flip-flop based on the number of paths that are activated but not detected. Thus, a predetermined number of scan flip-flops having a highest activation frequency are selected as observation points. In order to reduce processing time, the set of paths may comprise only the critical paths in the circuit.

In accordance with the invention the scan-based BIST architecture includes a test pattern generator that produces a first test pattern and a second test pattern, and a controller connected to the test pattern generator for generating a clock signal and a scan mode signal. The controller sets the scan mode signal to zero at an active edge of a first clock cycle and applies the first test pattern to a targeted path of the circuit, switches the scan mode signal to one before an active edge of a second clock cycle, holds the scan mode signal to one for two clock cycles while the second test pattern is applied to the targeted path and circuit responses of the combinational portion to the first test pattern are latched into the scan flip-flop at the active edge of the second clock cycle, and latches the second test vector into the scan flip-flop at an active edge of a third clock cycle. The first, second and third clock cycles are consecutive clock cycles. In a preferred embodiment, the test pattern generator is a multiseed linear feedback shift register.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

SUMMARY OF THE INVENTION

The present invention is directed to a method for testing path-delay faults in a sequential circuit that has been converted to one of a combinational circuit (full scan) or a less complex sequential circuit (partial scan) including a combinational portion and a plurality of scan flip-flops. The scan-based built-in self-test architecture for testing the circuit includes a test pattern generator for generating a first test pattern and a second test pattern, and a controller for generating a scan mode signal and a clock signal. Initially, the scan mode signal is set to zero and the first test pattern is applied to a targeted path in the sequential circuit at an active (rising or falling) edge of a first clock cycle. Before an active edge of a second clock cycle, preferably one-half cycle after the active edge of the first clock cycle, the scan mode signal is switched to one and a circuit response of the combinational portion to the first test pattern is captured in the scan flip-flop. Simultaneously, the second test pattern is applied to the targeted path at the active edge of the second clock cycle. The circuit response of the combinational portion to the second test pattern is captured in the scan flip-flop at an active edge of a third clock cycle while the scan mode signal remains held to one for two clock cycles. A determination is then made as to whether a signal transition is detected in the circuit response between the first and second test vectors in order to detect a path-delay fault. The first, second and third clock cycles in accordance with the invention are consecutive clock cycles.

In another embodiment of the invention, the fault coverage for path-delay faults may be improved by inserting observation points in the converted sequential circuit at an input

BRIEF DESCRIPTION OF THE DRAWINGS

In the drawings, wherein like reference numerals denote similar elements throughout the several views:

FIG. 3b is a timing diagram of a clock signal and scan mode signal for the test-per-scan scheme of FIG. 3a;

DETAILED DESCRIPTION OF THE PRESENTLY PREFERRED EMBODIMENTS

In the description of the invention the terms "high" and "one" are used interchangeably to denote a digital logic value "1"while the terms "low" and "zero" are used interchangeably to denote a digital logic value "0".

The present invention provides an apparatus for detecting path-delay faults and stuck-at faults in a sequential circuit that has been converted into a combinational circuit (full scan) or a less complex sequential circuit (partial scan), using a modified form of the scan-based BIST architecture described in U.S. Pat. No. 5,329,533 which, as pointed out above, is suitable only for the detection of stuck-at faults. The inventive arrangement is similar to that disclosed in U.S. Pat. No. 5,329,533 except for the test pattern generator and different test controller that employs a different clocking scheme that is applied during the test application mode. As discussed above, path-delay fault testing requires a pair of test patterns. Thus, the inventive scan-based BIST architecture for detecting path-delay faults generates two test vectors instead of the single test vector described in U.S. Pat. No. 5,329,533. A single LFSR may be used to generate multiple test patterns; however, the randomness of the test vectors thereby generated is insufficiently high and the fault coverage result is therefore relatively low. In order to achieve a relatively high randomness of the test vectors, a plurality of LFSRs may be used to exhaustively generate all possible $2^n$ vector pairs. Other known techniques for generating multiple test patterns, as for example described by Savir, J. and Berry, R. in "AT-Speed Test is Not Necessarily an AC Test", *Proc. of International Test Conference*, pp. 722–728 (1991) (incorporated by reference herein), include the use of double size generators, separating any two inputs that belong to the same cone of logic by at least a flip-flop in the scan chain, and algorithms for designing LFSR/cellular automata (CA) base generators and cyclic code base generators for maximal transition coverage. Still another device for generating multiple test vectors is a multiseed LFSR as described by Savir, J. and McAnney, W. H. in "A Multiple Seed Linear Feedback Shift Register", 41 *IEEE Transactions on Computers*, No. 2, pp. 250–252, February 1992, which is incorporated herein by reference. These conventional multiple test vector generators have previously been used only for path-delay fault testing of combinational circuits, not sequential circuits.

Figure 1:
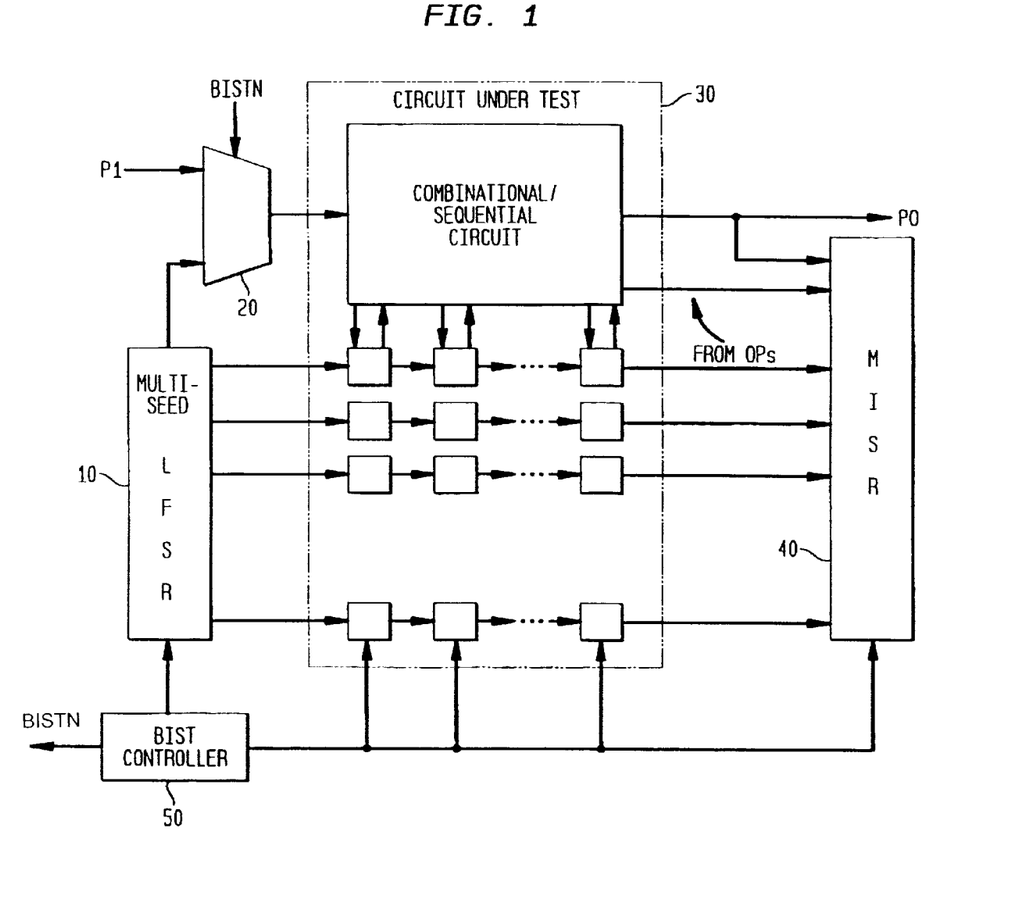
FIG. 1 is a modified scan-based built-in self-test architecture for detecting path-delay faults in a sequential circuit in accordance with the present invention.
Figure 2:
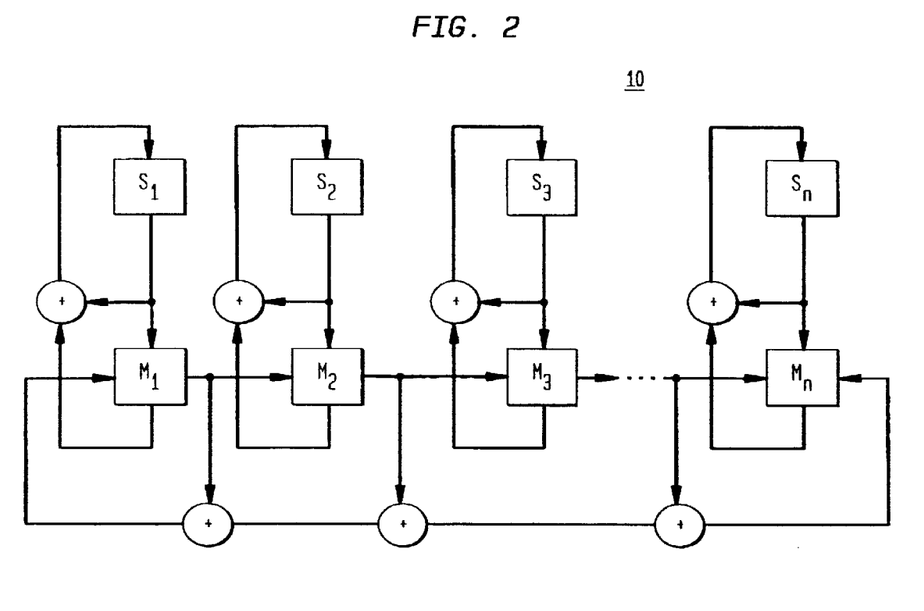
FIG. 2 is the multiseed linear feedback shift register of FIG. 1.

In the preferred embodiment shown in FIG. 1, a multiseed LFSR 10 is employed as a test pattern generator for path-delay fault testing. Although the use of a multiseed LFSR is preferred, any other known two-pattern generator which produces test vectors with a relatively high randomness may be used. The multiseed LFSR, shown separately in FIG. 2, is operated using two independent clocks. The first clock is responsible for driving the main register M(1) . . . M(n), while the second activates each 2-bit vertical LFSR with a constant polynomial $1+x+x^2$ that uses a shadow register S(1) . . . S(n). The main and shadow registers are initially loaded with a seed; the contents of the main and the shadow registers are then used alternatively to produce a two pattern test. A multiseed LFSR increases the randomness of test patterns and therefore also improves the fault coverage for stuck-at faults.

Another distinguishing feature of the inventive scan-based BIST architecture for path-delay fault testing from that taught by U.S. Pat. No. 5,329,533 is the modified clocking scheme employed in accordance with the invention by the BIST controller 50 during the test application mode. During testing the behavior of the CUT may be controlled by one of two different conventional clocking schemes, i.e. a test-per-scan scheme or a test-per-clock scheme, depending on the scan mode signal. In the test-per-scan scheme test vectors are shifted into the scan chain comprising scan flip-flops during shift mode while the scan mode signal is low. The number of clock cycles necessary to shift the test vectors into the scan chain depends on the length of the chain or, in a circuit having multiple scan chains, the length of the longest scan chain. By way of illustrative example, if the scan chain comprises 10 scan flip-flops, then the scan mode signal must be held low for 10 clock cycles in order to shift the test vectors into the scan flip-flops. Once the scan chain of 10 scan flip-flops is loaded with the test patterns, the circuit is switched to a test application mode in which the scan mode signal goes high and is held high for a single clock cycle while the response of the combinational portion is latched into the flip-flops in the scan chain. The scan mode signal is then set back to a low state and the 10 scan flip-flops in the scan chain are emptied in order to receive the next shifted test pattern. This clocking scheme is suitable for stuck-at faults which require only a single test pattern and wherein the fault effects are latched into the scan chain during the test application mode in a single clock cycle.

Figure 3A:
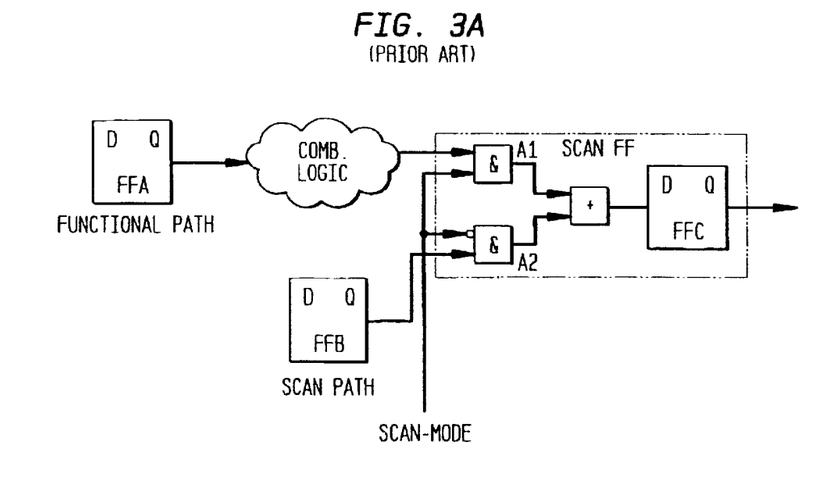
FIG. 3a is an illustrative example of a conventional test-per-scan scheme for stuck-at faults.
Figure 3B:
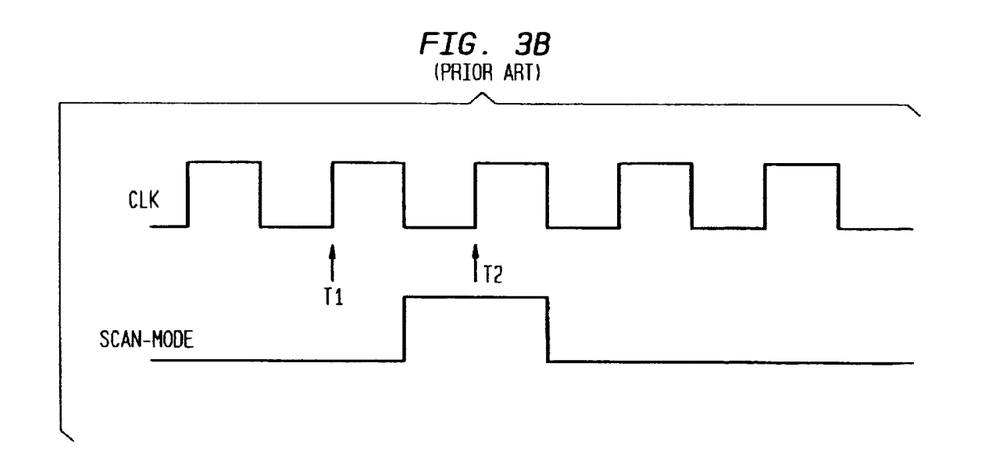

A conventional test-per-scan clocking scheme is depicted in FIG. 3b for the detection of stuck-at faults using single clock scan flip-flops as shown by way of illustrative example in FIG. 3a. The test vector is shifted through the scan chain and then launched into the circuit at time T1. At time T2, the faulty output response is captured at the destination flip-flop FFC. The scan mode signal is switched half-a-cycle before the active (i.e., rising or falling) edge of the clock signal at time T2 to facilitate at-speed testing during BIST testing.

This conventional test-per-scan clocking scheme for stuck-at faults is not suitable for use with path-delay faults which, as discussed above, require two test patterns in order to propagate a signal transition through a given path. If the conventional test-per-scan clocking scheme is used with two test vectors for path-delay fault testing, the two vectors will be applied before the scan mode signal goes high and the output response of the combinational portion cannot be latched into the scan flip-flop so that some faults will not be detected. Each test vector requires an application clock cycle (single clock cycle) for the fault output response of the combinational portion to be latched into the destination flip-flop FFC. For path-delay faults, therefore, in addition to the clocking cycles required to shift the test vectors into the scan flip-flops two application clock cycles are needed to latch the fault output response into the destination flip-flop FFC. The test-per-scan clocking scheme for stuck-at faults shown in FIG. 3b, however, provides for only a single application clock cycle and, thus, the transition launched from flip-flop FFA after two application clock cycles will always be blocked because the scan mode is held high for only a single application cycle after which it returns to a low state so that the off-input of the top AND gate A1 will have a controlling value of "0". Thus, the scan path instead of the functional path is activated and a fault output response of the combinational portion will never be latched into the scan flip-flop FFC.

Figure 4:
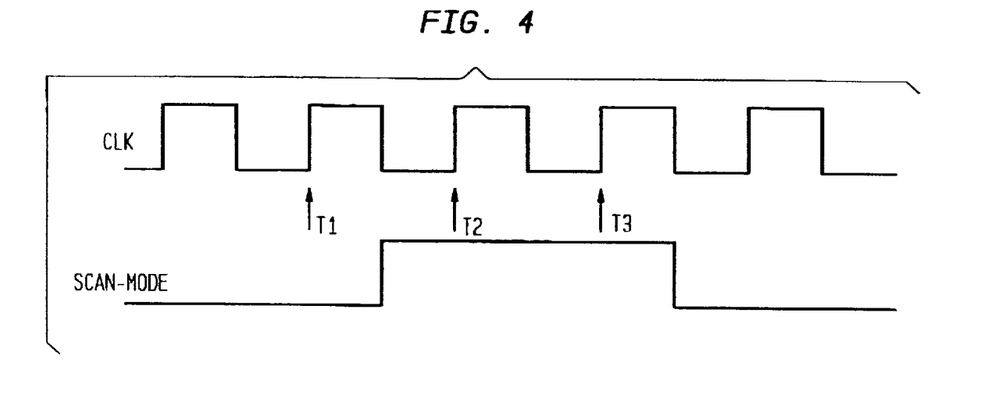
FIG. 4 is a timing diagram of a modified or extended clocking scheme for the scan mode signal for path-delay faults in accordance with the invention.

The inventive test-per-scan clocking scheme for detecting path-delay faults solves this problem by holding the scan mode signal high, e.g. to "1", for two application clock cycles so that the functional path through the scan multiplexor is exercised. An extended clocking scheme for path-delay faults in accordance with the present invention is shown in FIG. 4. A first test vector is launched into the functional path from flip-flop FFA at time T1 while the scan mode signal is held low, e.g. to "0", and the value from flip-flop FFB thus appears at the input of flip-flop FFC. Before the active edge of the next clock, the scan mode signal is switched to "1". At time T2, when the circuit response of the first test vector is actually captured, the off-path of the AND gate A1 is at a non-controlling value. As a result, the targeted path is exercised by the first vector from flip-flop FFA. In addition to capturing the circuit response from the first test vector at time T2, the second test vector is also launched in the on-path. If a transition is launched successfully, then the fault effect due to a delay in the targeted path will be captured at time T3. Using the inventive extended clocking scheme all targeted paths are exercised using a pair of test vectors that generates either a rising or a falling signal transition. It should be noted that the second test vector applied from flip-flop FFA at time T2 is not a scanned vector but, rather, the response of the combinational portion driving FFA when exercised by the first test vector.

This same clocking scheme is suitable for a test-per-clock scheme in which the scan mode signal is switched at a substantially faster rate so that the faults which appear at the input of the destination scan flip-flop are latched into the scan flip-flop more frequently. As a consequence, irrespective of whether the scheme is test-per-scan or test-per-clock, the scan mode signal in accordance with the inventive clocking scheme is extended for an additional clock cycle to enable detection of path-delay faults in a sequential circuit.

The inventive scan-based BIST architecture for path-delay faults is suitable without regard to the type of scan flip-flops used so long as the inventive clocking scheme, as discussed above, is employed. For example, many circuit designs employ dual-clock or multi-clock scan flip-flops, e.g. three latch based scan flip-flops. Multi-clock scan flip-flops use independent clocks during the test application and shift modes of operation and thereby eliminate the need for a multiplexor at the input of the scan flip-flop. By switching between the two clocks the path-delay faults can be latched into the destination scan flip-flop. The use of multi-clock scan flip-flops is advantageous because it eliminates the need for the multiplexor and, thus, decreases area overhead and application timing.

Although converting a sequential circuit to a combinational (full scan) or less complex sequential circuit (partial scan) improves the fault coverage result, there are often a few random pattern resistant faults that are not testable even after the application of millions of test vectors. In addition, certain parts of a circuit may have very little, if any, switching activity that makes excitation of faults in those remote regions difficult and economically impracticable. In these cases, test points such as control points and observation points may be inserted into the CUT to improve the fault coverage result. Specifically, a control point is used to improve the capability to excite a fault, whereas an observation point improves the propagation of a fault effect to a primary output. These two types of test points can be used to improve the testability of a circuit.

Controllability and observability analyses are well known and widely used to determine the exact positions in the CUT for introducing the test points for maximum testability benefits. As discussed above, in path-delay fault testing, the primary objective is to detect excessive propagation delays in critical paths, e.g. the longest paths of a circuit. The introduction of control points in which additional logic gates are inserted into paths of the CUT has a deleterious effect on the fault coverage result because the additional gates increase the propagation delay for the particular path and produce new paths, some of which may themselves be critical paths. The use of control points is therefore not beneficial when testing for path-delay faults.

A path is defined as one of the following: 1) from a primary input of the entire circuit to an output of any flip-flop in the circuit; 2) from an output of any flip-flop in the circuit to the primary output of the entire circuit; or 3) from an output of any flip-flop to the output of the next flip-flop. In order to excite a path-delay fault, a signal transition must propagate through the targeted path while the off-inputs of the gates have a non-controlling value.

Figure 5:
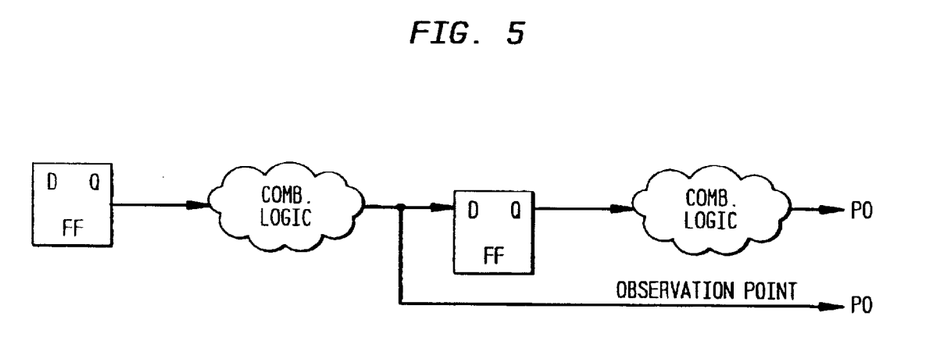
FIG. 5 is an illustrative example of insertion of observation points at the input of a destination scan flip-flop in a sequential circuit for improving path-delay fault detection in accordance with the present invention.

In a test-per-scan clocking scheme, the observability of the circuit is relatively low because path-delay fault effects are captured only when the circuit is operating in a test application mode, e.g. when the scan mode signal is "1". However, pairs of test patterns are continuously being applied to the combinational portion and, as a result, some of the fault effects that appear at the input of the flip-flops in the scan chain during the shift mode will be overwritten and not detected. It has been recognized that the observability of path-delay faults in a sequential circuit may be improved by inserting observation points at the input of the destination scan flip-flop of a targeted path. FIG. 5 illustrates by way of example the insertion of observation points at the input of a destination scan flip-flop in a sequential circuit for improving the fault coverage of path-delay faults.

The insertion of observation points at the input of the destination scan flip-flop during path delay-testing is based on the general assumption that defects which result from manufacturing typically have a substantially uniform effect on the entire circuit and, thus, at each position along a particular path. Therefore, if no path-delay fault is detected at the input of the destination scan flip-flop, then statistically the chances of a path-delay fault occurring along the path between the input and output of the destination scan flip-flop is so insignificant as may be ignored.

In an alternate embodiment, on the other hand, even the small statistical probability of a fault occurring between the input and output of a destination scan flip-flop can be eliminated by verifying that the path therebetween is itself fault-free. For example, before performing a path-delay fault simulation of a set of targeted paths as discussed above, gate delay fault simulation may be performed between the input and output for each destination scan flip-flop having an observation point inserted at its input to insure that the path is fault-free. The number of observation points inserted at the input of the destination scan flip-flops is limited and, thus, the number of test vectors and the application time for simulation of gate delay faults for this limited number of scan flip-flops is relatively small.

Figure 6A:
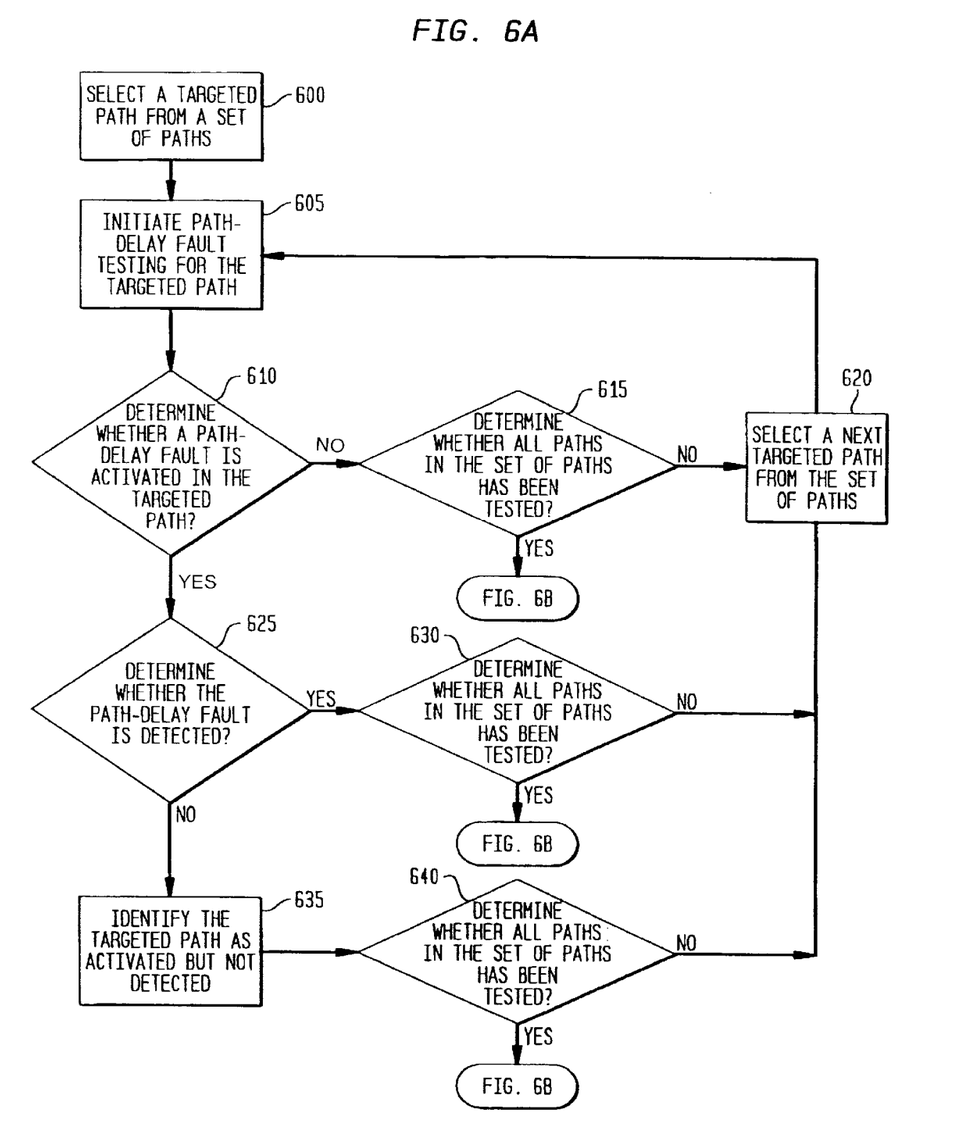
FIGS. 6a and 6b depict a flow chart for selection of observation points in a sequential circuit to improve the fault coverage for path-delay faults in accordance with the invention.
Figure 6B:
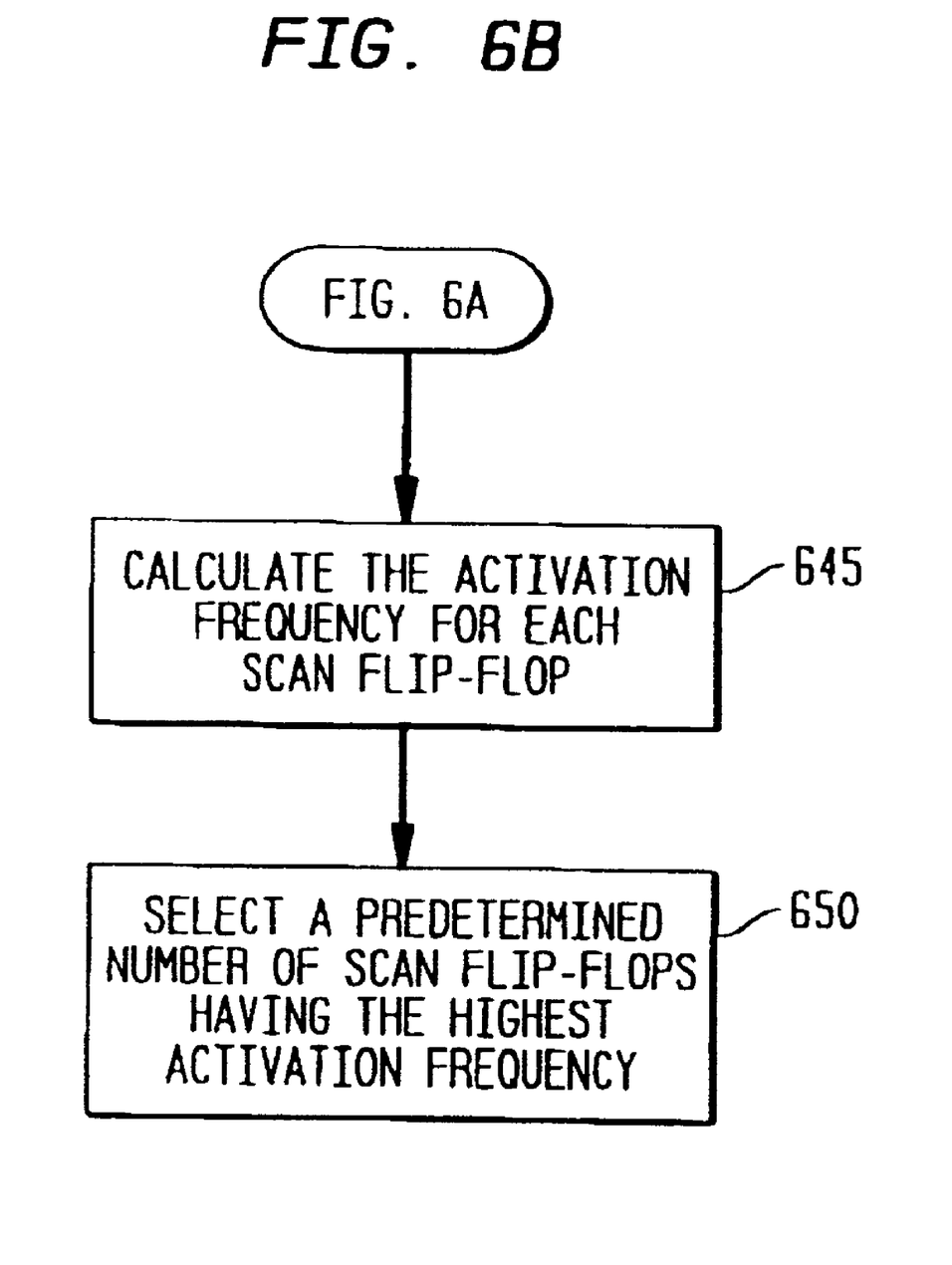

The selection of observation points targeting path-delay faults in a sequential circuit is based on a cost benefit analysis of improved fault coverage versus increased area overhead. The selection of observation points must therefore be optimized. FIGS. 6a and 6b depict a flow chart of an inventive method for optimizing the selection of observation points in a sequential circuit to increase fault coverage for path-delay faults. Initially, at step 600, a targeted path is selected from a set of paths. The set of paths may comprise all possible paths in the circuit, although such exhaustive testing results in unacceptable test generation and fault simulation times. To reduce the overall processing time a subset of paths is usually tested, as for example all critical paths. Next, in step 605, path-delay fault testing is performed in the targeted path. A check is made in step 610 to determine whether a path-delay fault has been activated in the targeted path. A path is activated if a signal transition propagates through the path and a fault effect appears at the input of a destination scan flip-flop while shifting the test patterns into the scan chain. If a path-delay fault has not been activated in the targeted path then in steps 615 and 620 a next targeted path is selected from the set of paths and path-delay testing is performed for this next targeted path. Otherwise, if a path-delay fault has been activated then, a check is performed in step 625 to determine whether the path-delay fault is detected. A path-delay fault is detected if it appears at a primary output of the entire circuit or at an output of a destination scan flip-flop. Thus, a path-delay fault will only be detected if the scan mode signal goes high to enable the test application mode when the fault effect appears at the input of the destination scan flip-flop; otherwise, if the circuit is in the shift mode, then the fault appearing at the input of the destination scan flip-flop will be overwritten and undetected. If the path-delay fault is detected then, in steps 640 and 620, a next targeted path is selected and path-delay testing is performed for that next targeted path; otherwise, in step 635 the selected path is identified as activated but not detected.

After path-delay testing has been performed for every path from the set of paths, the activation frequency for each scan flip-flop is calculated in step 645 based on the total number of path-delay faults that are activated but not detected. Finally, in step 650 a predetermined number of scan flip-flops having the highest activation frequency are selected as observation points. The activation frequency $\phi$ is defined as $$\phi = \frac{\text{Number of paths that are activated but not detected}}{\text{Total number of paths terminating in a flip-flop}} \quad (1)$$

Insertion of the observation points at the inputs of the scan flip-flops is advantageous in that it bypasses the multiplexor of the scan flip-flop in the targeted path. Moreover, path-delay faults, in addition to activated faults detected at the observation point, which may otherwise have been masked due to switching of the scan multiplexors, are also detected since the observation points are inserted at the inputs of the scan flip-flops.

Thus, as should now be apparent, in a test-per-scan clocking scheme the faults are not always detectable at the output of the scan flip-flop because the scan mode signal does not go high until all of the fault effects are shifted into the scan flip-flop. In order to solve this problem the observation points are inserted at the inputs of the scan flip-flops so as to enable observation of the faults as they are shifted.

While there have been shown and described and pointed out fundamental novel features of the invention as applied to preferred embodiments thereof, it will be understood that various omissions and substitutions and changes in the form and details of the method described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Substitutions of elements and method steps from one described embodiment to another are also fully intended and contemplated. It should also be understood that the drawings are not necessarily drawn to scale but are merely conceptual in nature. It is the intention, therefore, to be limited only as indicated by the scope of the claims appended hereto.

We claim:

1. A method for testing path-delay faults in a sequential test circuit convertible to one of a combinational circuit and a simplified sequential circuit comprising a combinational portion and a plurality of scan flip-flops, and using a scan-based built-in self-test architecture including a test pattern generator for generating a first test pattern, and a second test pattern, and a controller for generating a scan mode signal and a clock signal, comprising the steps of:

(a) selecting an observation point for insertion in the test circuit at an input of one of the plural scan flip-flops by
  (i) performing path-delay fault testing for each path in a set of paths in the test circuit;
  (ii) identifying fault paths from the set of paths in which a fault is activated but not detected;
  (iii) calculating an activation frequency φ for each scan flip-flop based on a quantity of the faults identified as being activated but not detected and;
  (iv) selecting as observation points a predetermined number of the scan flip-flops having a highest calculated activation frequency;

(b) setting the scan mode signal to logic zero;

(c) applying the first test pattern to a targeted path in the test circuit at an active edge of a first clock cycle;

(d) switching the scan mode signal to logic one before an active edge of a second clock cycle;

(e) capturing in the scan flip-flop a circuit response of the combinational portion to the applied first test pattern and applying the second test pattern to the targeted path at the active edge of the second clock cycle;

(f) capturing in the scan flip-flop a circuit response of the combinational portion to the applied second test pattern at an active edge of a third clock cycle while the scan mode signal remains held to logic one for two clock cycles; and (g) determining whether a signal transition is detected in the circuit response between the first and second test patterns;

wherein said first, second and third clock cycles are consecutive clock cycles.

2. The method in accordance with claim 1, wherein said step (d) comprises switching the scan mode signal to logic one at a time one-half clock cycle after the active edge of the first clock cycle.

3. The method in accordance with claim 1, wherein in said step (a)(iii) said activation frequency φ is calculated using $$\phi = \frac{\text{Quantity of paths activated but not detected}}{\text{Total numbers of paths termination in a flip-flop}}.$$

4. The method in accordance with claim 3, wherein said step (a)(iii) further comprises sorting in one of ascending and descending order the scan flip-flops based on the activation frequency of each of the scan flip-flops.

5. The method in accordance with claim 1, wherein said set of paths comprises critical paths in the test circuit.

6. The method in accordance with claim 1, wherein the test pattern generator is a multiseed linear feedback shift register.

7. The method in accordance with claim 1, wherein the active edge is a rising edge of a clock cycle.

8. The method in accordance with claim 1, wherein the active edge is a falling edge of a clock cycle.

* * * * *